(12) United States Patent
Guelen et al.

(10) Patent No.: US 6,677,234 B1
(45) Date of Patent: Jan. 13, 2004

(54) METHOD OF SELECTIVELY FORMING SILICIDE

(75) Inventors: Josephus F. A. M. Guelen, Malden (NL); Eric Gerritsen, Nijmegen (NL); Walter J. A. De Coster, St. Nazaire-les-Eynes (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/369,539

(22) Filed: Aug. 6, 1999

(30) Foreign Application Priority Data

Aug. 11, 1998 (EP) .............................. 98402032

(51) Int. Cl.$^7$ .............................. H01L 21/44
(52) U.S. Cl. .................. 438/664; 438/717; 438/738
(58) Field of Search .................. 438/677, 630, 438/649, 651, 671, 717, 664, 737, 738, 740, 743, 744

(56) References Cited

U.S. PATENT DOCUMENTS

| | | | |
|---|---|---|---|
| 4,769,686 A | | 9/1988 | Horiuchi et al. ............ 357/23.8 |
| 5,589,423 A | | 12/1996 | White et al. ................ 437/228 |
| 5,872,063 A | * | 2/1999 | Chao et al. ................. 438/762 |
| 5,924,011 A | * | 7/1999 | Huang ........................ 438/655 |
| 5,933,739 A | * | 8/1999 | Lin ............................ 438/301 |
| 5,956,610 A | * | 9/1999 | En et al. ..................... 438/630 |
| 6,004,878 A | * | 12/1999 | Thomas et al. ............. 438/655 |

FOREIGN PATENT DOCUMENTS

JP 07161949 A 6/1995 ........... H01L/27/14

OTHER PUBLICATIONS

Wolf, Stanley. Silicon Processing for the VLSI Era, vol. 2: Process Integration. Lattice Press, 1990. pp. 45–50.*

* cited by examiner

*Primary Examiner*—Wael Fahmy
*Assistant Examiner*—Ginette Peralta
(74) *Attorney, Agent, or Firm*—Ernestine C. Bartle

(57) ABSTRACT

In a crystalline silicon body a shallow trench insulation is made by etching a groove and filling it with silicon oxide. Ridges of polysilicon are made on the surface of the silicon body by applying a layer of polysilicon and patterning it with a known technique. Spacers of silicon nitride are provided on the side walls of the polysilicon ridges. A first layer of silicon nitride, a second layer of TEOS and a patterned resist layer are applied. The TEOS layer is etched by immersion in a solution of 0.36% HF for 14 minutes. Subsequently, the resist is stripped in $H_2SO_4$ or peroxide. The silicon nitride layer is etched by immersion in phosphoric acid of 165° C. for 15 minutes using the TEOS layer as a mask. A titanium layer is applied. Subsequently, the body is rapidly heated to a temperature of 760° C. at which it is kept for 20 seconds. During this rapid thermal treatment titanium silicide is formed at locations where the titanium is in contact with silicon i.e. on top of the polysilicon ridges and also on the exposed crystalline regions.

10 Claims, 4 Drawing Sheets

METHOD OF SELECTIVELY FORMING SILICIDE

BACKGROUND OF THE INVENTION

The invention relates to a method of selectively forming silicide comprising the steps of:
providing a body with silicon regions,
applying a mask layer that covers a part of the silicon regions,
applying a suitable material capable of silicide-formation, and
forming silicide by inducing a reaction between said material and silicon of the uncovered silicon regions.

The invention further relates to a method for manufacturing a semiconductor device comprising the steps of:
providing a body in which electronic elements can be formed,
providing silicon regions for interconnecting the electronic elements,
applying a mask layer that covers a part of the silicon regions,
applying a suitable material capable of silicide-formation, and
forming silicide by inducing a reaction between said material and uncovered silicon.

Such methods are known from JP-A-07161949. In the known method, a semiconductor body with exposed silicon regions is covered with an oxide film. A patterned resist layer is applied and the oxide film is locally removed. A high melting point metal is applied and silicide is formed at the location where the oxide film was locally removed.

SUMMARY OF THE INVENTION

It is an object of the invention to provide a method of selective by forming silicide which results in a reduced resistance of the silicide compared to the known method.

The methods according to the invention are characterized in that the mask layer is formed by
applying a first layer of a first material,
applying a second layer of a second material,
applying a patterned resist layer,
etching the second layer by means of a first etch process using the patterned resist layer as a mask, and
etching the first layer using the second layer as a mask by means of a second etch process that is highly selective with respect to the silicon regions.

It has been found that due to these measures the resistance of the silicide is less than that of silicide formed with the known method. It is believed that this can be attributed to the following reasons. In the known process, the silicon surface is probably damaged and/or contaminated so that the formation of silicide is hampered and the resistance of the silicide is negatively affected. In the method according to the invention the silicon is treated very gently and the formation of silicide is hardly affected by the patterning of the mask layer. It has further been found that the method according to the invention meets other requirements, such as a good definition of the mask layer and an acceptable process time.

Due to the measure as defined in dependent claim 2, the second etch process can be controlled more accurately so that the definition of the mask layer is improved.

Due to the measures as defined in dependent claim 3, the second layer can be etched selectively relative to the first layer by means of commonly used techniques so that the first layer can be relatively thin and hence easily patterned with a good definition.

Due to the measure as defined in dependent claim 4, a very low sheet resistance of the silicide has been obtained.

Due to the measure as defined in dependent claim 5, the silicon is protected by the silicon oxide top layer during deposition and etching of the first layer. Due to this protection, contamination of the silicon is further counteracted. If the top layer has a thickness of less than 20 nm, this top layer will not prevent the formation of silicide. However, it is preferred to remove the top layer before depositing the material capable of silicide-formation. This can, for example, be achieved by immersion in HF.

Due to the measures as defined in dependent claim 8, neither the silicon nor the isolating material under the first layer is affected by the second etch process. Consequently, a low resistance of the silicide is obtained and the isolating trenches remain intact so that the method is applicable for the production of semiconductor devices with very small dimensions.

Due to the measures as defined in dependent claim 9, no traces of the mask layer will remain on side walls of the silicon ridges. Consequently, the contact area between the material capable of silicide formation and the silicon is not reduced due to traces of the mask so that the formation of silicide is not hampered by the use of the mask layer.

Due to the measures as defined in dependent claim 10, the spacers are also etched during etching of the first layer. Consequently, a larger part of the side portions of the silicon ridges come into contact with the material capable of silicide-formation so that the silicide formation is improved and the resistance of the ridges is decreased.

These and other aspects of the invention will be apparent from and elucidated with reference to the figures of the drawing and the embodiments described hereafter.

DETAILED DESCRIPTION OF THE INVENTION

Figure 1:
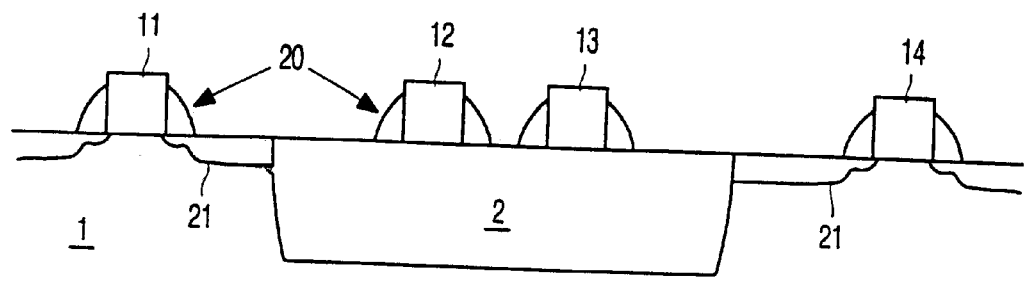
FIG. 1 shows a detail of a semiconductor body.

The invention will now be described in greater detail with reference to the figures of the drawing.

FIG. 1 shows a detail of a crystalline silicon body 1 wherein a shallow trench insulation 2 is made by etching a groove and filling it with silicon oxide. Ridges 11, 12, 13 and 14 of polysilicon are made on the surface of the silicon body 1 by applying a layer of polysilicon and patterning it with a known technique. Spacers 20 of silicon nitride are provided on the side walls of the polysilicon ridges 11, 12, 13 and 14. In a subsequent diffusion process, these spacers function as filters in order to obtain proper diffusion profiles 21. Optionally, a silicon oxide top layer (not shown) with a thickness of 3 nm is formed on the silicon by oxidizing the silicon.

Figure 2:
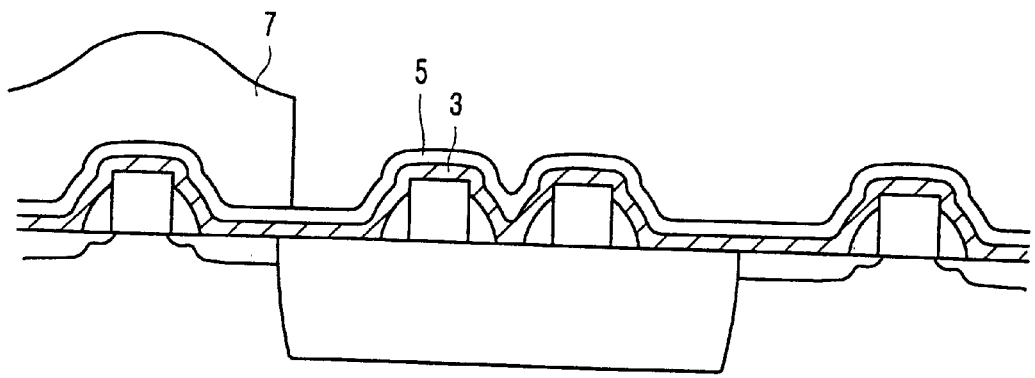
FIG. 2 shows the same detail after applying a first layer of silicon nitride, a second layer of TEOS and a patterned resist layer.

FIG. 2 shows the detail of FIG. 1 after applying a first layer 3 of silicon nitride, a second layer 5 of TEOS and a patterned resist layer 7. The silicon nitride layer 3 has a thickness of 30 nm and has been applied by LPCVD at 780° C. The TEOS layer 5 has a thickness of 42 nm and has been applied by PECVD at 450° C.

Figure 3:
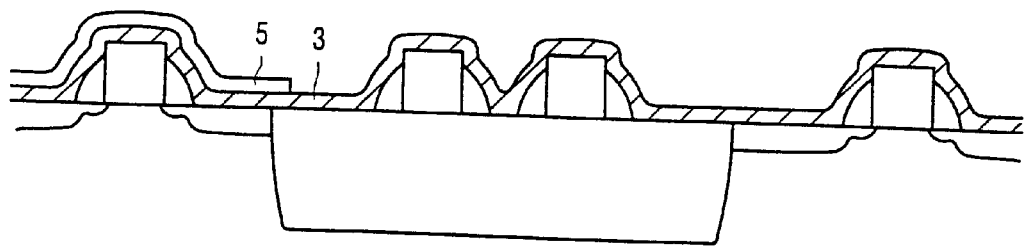
FIG. 3 shows the same detail after etching the second layer and stripping the resist layer.

FIG. 3 shows the same detail after etching the second layer 5 and stripping the resist layer 7. The TEOS layer 5 has been etched by immersion in a solution of 0.36% HF during 14 minutes. Subsequently, the resist has been stripped in $H_2SO_4$ or peroxide.

Figure 4:
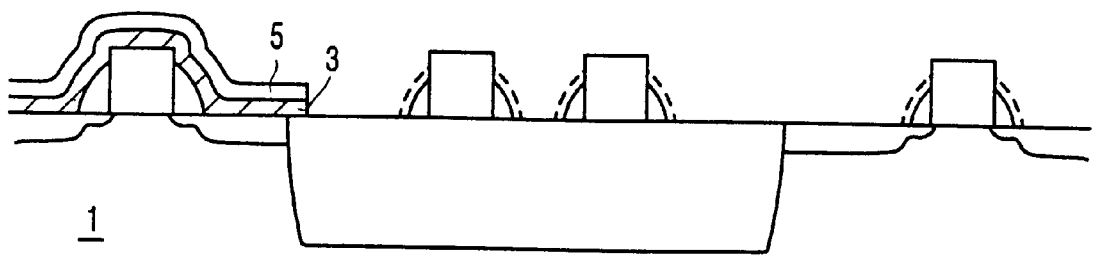
FIG. 4 shows the same detail after etching the first layer.

FIG. 4 shows the detail of the semiconductor body 1 after etching the first layer 3. The silicon nitride layer 3 has been etched by immersion in $H_3PO_4$ of 165° C. during 15 minutes using the TEOS layer 5 as a mask. Due to this etch step, the spacers are partly etched so that a larger part of the ridges comes into contact with the titanium.

Figure 5:
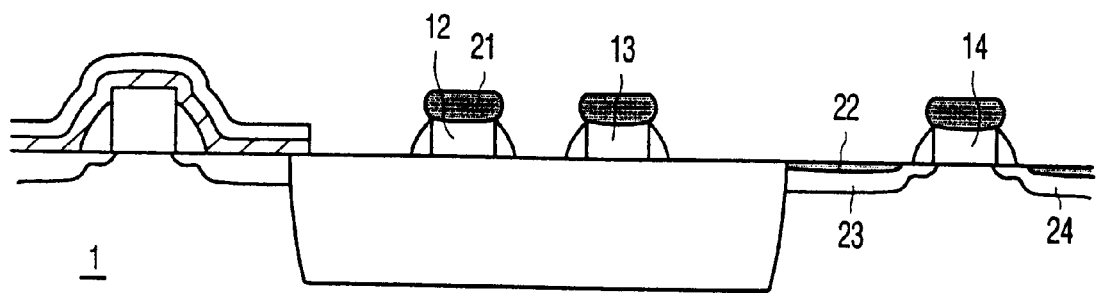
FIG. 5 shows the same detail after applying a titanium layer, forming silicide by means of a thermal treatment and removing the titanium which has not reacted to form titanium silicide.

FIG. 5 shows the same detail after applying a titanium layer, forming silicide by means of a thermal treatment and removing the titanium which has not reacted to form titanium silicide. The titanium layer has a thickness of 30 nm and has been deposited by PVD. Optionally, the silicon oxide top layer, if present, is removed by dipping the body 1 in an HF solution. Subsequently, the body is rapidly heated to a temperature of 760° C. at which it is kept for 20 seconds. During this rapid thermal treatment, titanium silicide 21, 22 is formed at locations where the titanium was in contact with silicon regions i.e. on top of the polysilicon ridges 12, 13 and 14 and also on the exposed crystalline silicon regions 23 and 24. During the thermal treatment, titanium not in contact with silicon regions has reacted with the material of the spacers and the isolating material so that titanium nitride and titanium oxide is formed. This titanium nitride and titanium oxide is removed with an etchant containing ammonia and peroxide which etchant is selective relative to titanium silicide. After removal of the titanium nitride and titanium oxide, the body is rapidly heated to 850° C. at which temperature it is kept for 20 seconds in order to transform the titanium silicide to its low resistivity C54 phase.

Figure 6:
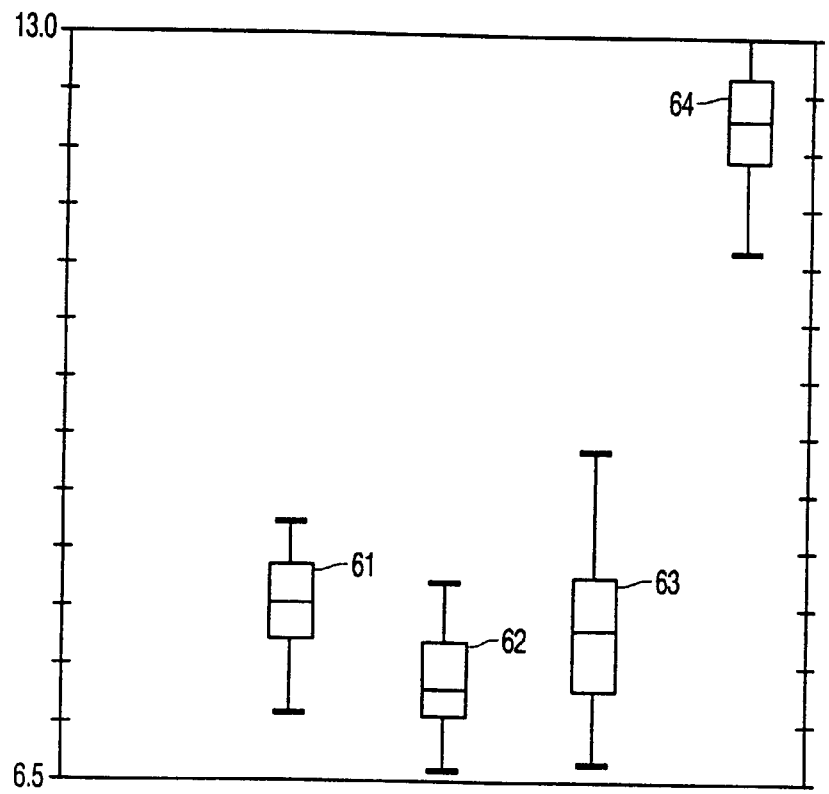
FIG. 6 shows box plots of the sheet resistance of silicidized 0.25 micrometer wide p+ polysilicon lines of samples made by means of the method according to the invention in comparison to that of samples made by a prior art method.

FIG. 6 shows box plots of the sheet resistance of silicidized 0.25 micrometer wide p+ polysilicon lines of samples made by means of the method according to the invention in comparison to that of samples made by a prior art method. On the vertical scale the sheet resistance is expressed in Ohm per Square. The box-plots 61, 62 and 63, respectively, correspond to three different batches of forty five samples which where etched in phosphoric acid for 11 minutes, 14 minutes and 16 minutes, respectively. The box-plot 64 corresponds to a batch of thirty six samples made by a method wherein the mask layer is formed by applying a 68 nm thick TEOS layer and partial removal of the TEOS layer by plasma etching.

Each box-plot is dimensioned as follows: the large horizontal line in the box corresponds to the median of the measurement values; the bounding lines of the box indicate the limit of 50% of the measurement values around the median; the small horizontal lines indicate the highest and lowest measurement values, values lying beyond said measurement values being excluded.

Figure 7:
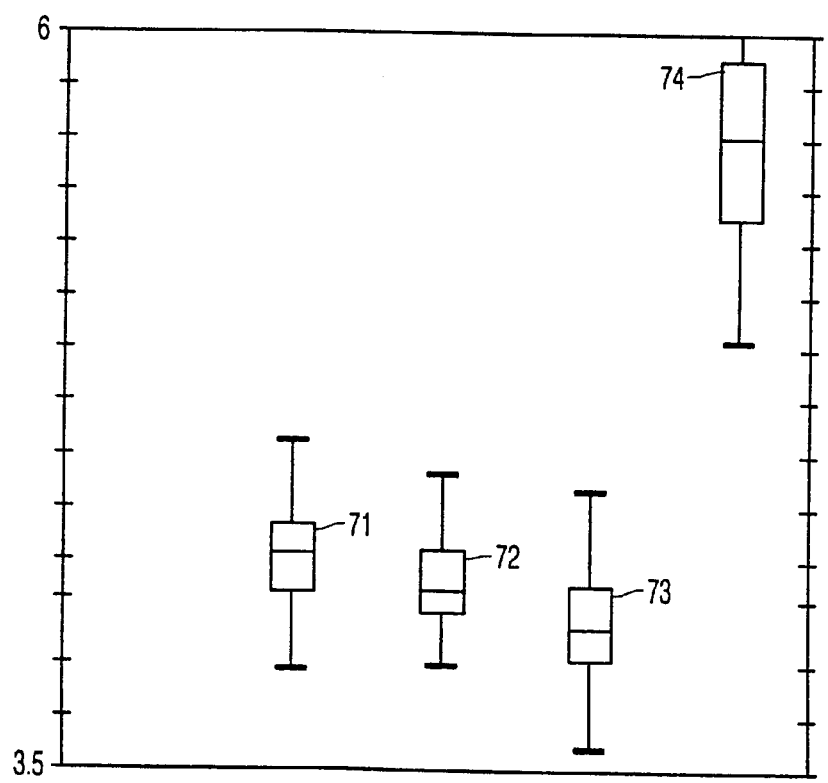
FIG. 7 shows box plots of the sheet resistance of silicidized N+ diffused crystalline silicon regions of samples made by means of the method according to the invention in comparison to that of samples made by a prior art method.

FIG. 7 shows box plots of box plots of the sheet resistance of silicidized N+ diffused crystalline silicon regions of samples made by means of the method according to the invention in comparison to that of samples made by the prior art method. On the vertical scale the sheet resistance is expressed in Ohm per square. The box-plots 71, 72 and 73, respectively, correspond to three different batches of forty five samples which where etched in phosphoric acid for 11 minutes, 14 minutes and 16 minutes, respectively. The box-plot 74 corresponds to a batch of thirty six samples made by a method wherein the mask layer is formed by applying a 68 nm thick TEOS layer and partial removal of the TEOS layer by plasma etching.

Figure 8:
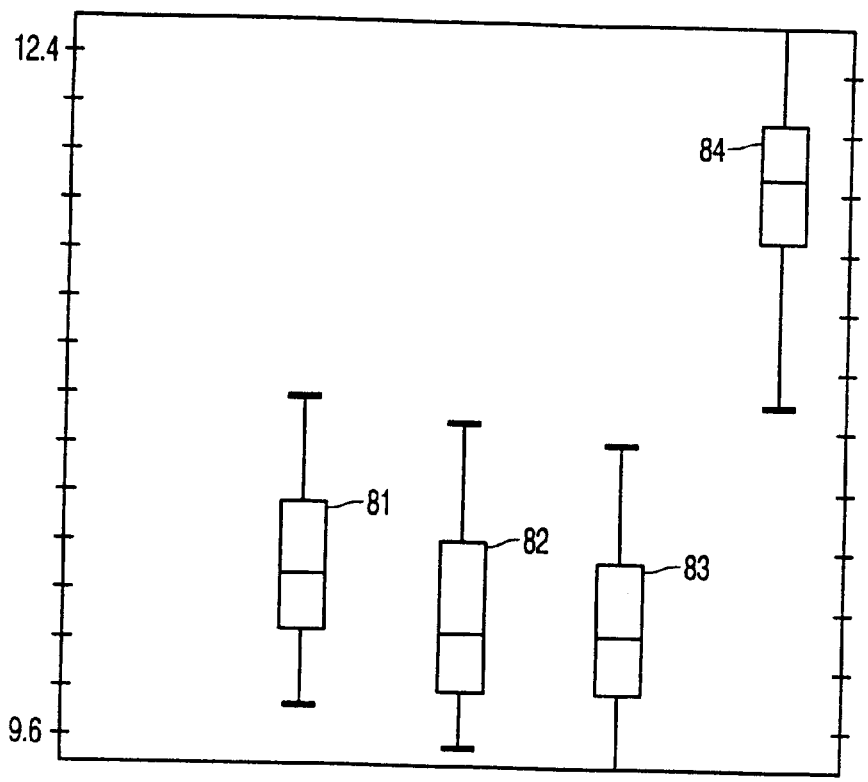
FIG. 8 shows box plots of the contact resistance on silicidized N+ diffused polysilicon region of samples made by means of the method according to the invention in comparison to that of samples made by a prior art method.

FIG. 8 shows box plots of the contact resistance on silicidized N+ diffused polysilicon regions of samples made by means of the method according to the invention in comparison to that of samples made by the prior art method. On the vertical scale, the contact resistance is expressed in Ohm per contact. The contact resistance is measured with a so-called Kelvin structure consisting of many tungsten contacts. The box-plots 81, 82 and 83, respectively, correspond to three different batches of forty five samples which where etched in phosphoric acid for 11 minutes, 14 minutes and 16 minutes, respectively. The box-plot 84 corresponds to a batch of thirty six samples made by a method wherein the mask layer is formed by applying a 68 nm thick TEOS layer and partial removal of the TEOS layer by plasma etching.

Figure 9:
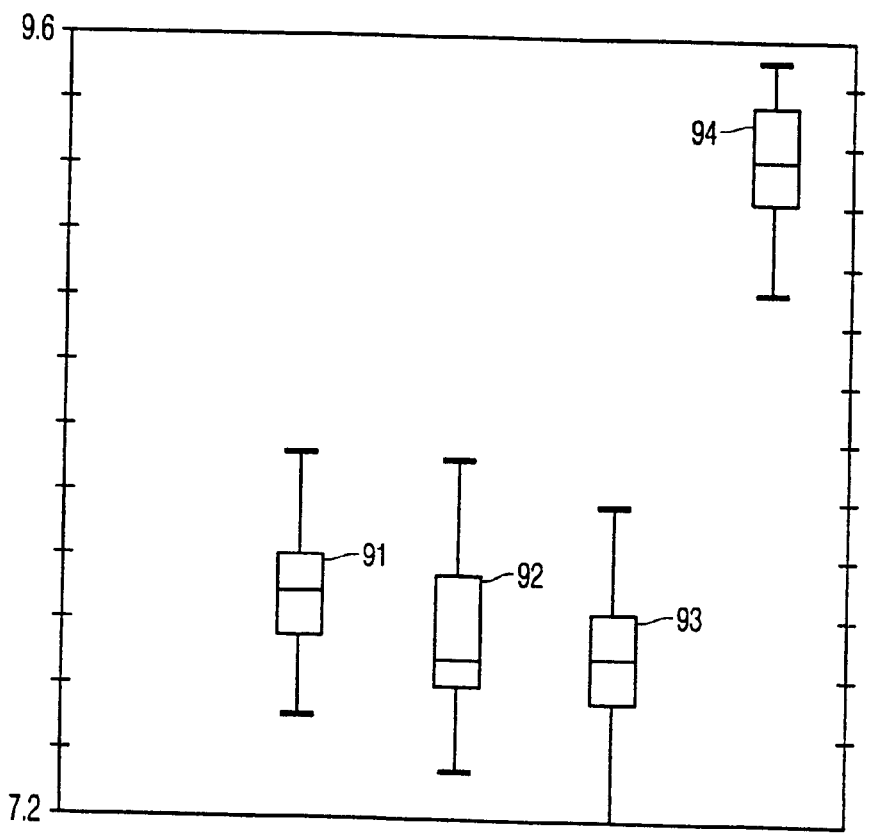
FIG. 9 shows box plots of the resistance on silicidized N+ diffused crystalline silicon regions of samples made by means of the method according to the invention in comparison to that of samples made by a prior art method.

FIG. 9 shows box plots of the contact resistance on silicidized N+ diffused crystalline silicon regions of samples made by means of the method according to the invention in comparison to that of samples made by a prior art method. On the vertical scale, the contact resistance is expressed in Ohm per contact. The box-plots 91, 92 and 93, respectively, correspond to three different batches of forty five samples which where etched in phosphoric acid for 11 minutes, 14 minutes and 16 minutes, respectively. The box-plot 94 corresponds to a batch of thirty six samples made by a method wherein the mask layer is formed by applying a 68 nm thick TEOS layer and partial removal of the TEOS layer by plasma etching.

It will be clear from FIGS. 6 to 9 that the methods according to the invention result in a considerable reduction of the resistance of the silicide in comparison with the known method.

It is to be noted that the invention is not limited to the embodiments described above. The material capable of silicide-formation may for example also be Ni, W, Co, Fe, Mo or Pt. Other combinations for the first and the second material are also possible. For example, in another embodiment of the invention, the first material may be a silicon nitride or silicon oxynitride formed by any means, the second material may be a silicon oxide formed by any means, the first etch process may be either a wet process or a plasma process and the second etchant may be any wet oxynitride-etchant or wet nitride-etchant which is selective relative to the silicon regions or, if a silicon oxide top layer is used, a plasma oxynitride-etchant or plasma nitride-etchant which is selective relative to the silicon oxide top layer.

It will be clear to the person skilled in the art that the shallow trench insulation, the presence of silicon ridges and the spacers are not required to benefit from the merits of the invention.

What is claimed is:

1. A method for selectively forming silicide comprising the steps of:
   providing a body with silicon regions,
   applying a mask layer that covers a part of the silicon regions,
   applying a suitable material capable of silicide formation, and
   forming a silicide by inducing a reaction between said material and silicon of uncovered silicon regions, characterized in that the mask layer is formed by
      applying a first layer of a first material to said silicon regions,
      applying a second layer of a second material,
      applying a patterned resist layer,
      etching the second layer by means of a first etch process using the patterned resist
      layer as a mask,
      removing the patterned resist layer, and
      etching the first layer using the second layer as a mask by means of a second etch process, different from said first etch process, which second etch process is highly selective relative to the silicon regions.

2. A method as claimed in claim 1, characterized in that the first material is silicon nitride and the second material is an oxide.

3. A method as claimed in claim 1, characterized in that the second etch process is a wet etch process using phosphoric acid.

4. A method as claimed in claim 1, characterized in that the method further comprises a step of providing the silicon regions with a silicon oxide top layer before applying the mask layer.

5. A method as claimed in claim 4, characterized in that the method further comprises a step of removing the silicon oxide top layer before applying the material capable of silicide formation.

6. A method for manufacturing a semiconductor device comprising the steps of:
   providing a body in which electronic elements can be formed,
   providing silicon regions for interconnecting the electronic elements,
   applying a mask layer that covers a part of the silicon regions,
   applying a suitable material capable of silicide formation, and
   forming silicide by inducing a reaction between said material and silicon of uncovered silicon regions, characterized in that the mask layer is formed by
      applying a first layer of a first material,
      applying a second layer of a second material,
      applying a patterned resist layer,
      etching the second layer by means of a first etch process using the patterned resist layer as a mask,
      removing the patterned resist layer, and
      etching the first layer using the second layer as a mask by means of a second etch process, different from the first etch process,
         which second etch process is highly selective relative to the silicon regions.

7. A method for manufacturing a semiconductor device as claimed in claim 6, characterized in that the method further comprises the steps of:
   providing trenches in the body,
   filling the trenches with an electrically insulating material, and wherein
      said first material is different from said electrically insulating material, and
      said second etch process is highly selective relative to said electrically insulating material.

8. A method for manufacturing a semiconductor device as claimed in claim 6, characterized in that the method comprises the step of providing silicon ridges on said body, the ridges having an exposed top portion and exposed side portions extending from the top portion to a bottom portion, and wherein the first and the second etch processes are isotropic etch processes.

9. A method for manufacturing a semiconductor device as claimed in claim 8, characterized in that the method further comprises a step of forming silicon nitride spacers on the side portions near said bottom portion, and wherein the first material is silicon nitride.

10. A method for manufacturing a semiconductor device as claimed in claim 9, characterized in that the second etch process is a wet etch process in phosphoric acid.

* * * * *